(12) United States Patent
Vincent et al.

(10) Patent No.: US 9,874,602 B2
(45) Date of Patent: Jan. 23, 2018

(54) TEST BOARD SUPPORT PLATFORM FOR SUPPORTING A TEST BOARD

(71) Applicants: Christian Jean-Gabriel Vincent, Fonsorbes (FR); Jean Dalmon, Lagarde (FR); Pierre Michel Georges Jalbaud, Segreville (FR)

(72) Inventors: Christian Jean-Gabriel Vincent, Fonsorbes (FR); Jean Dalmon, Lagarde (FR); Pierre Michel Georges Jalbaud, Segreville (FR)

(73) Assignee: NXP USA, Inc., Austin, TX (US)

( * ) Notice: Subject to any disclaimer, the term of this patent is extended or adjusted under 35 U.S.C. 154(b) by 274 days.

(21) Appl. No.: 14/660,560

(22) Filed: Mar. 17, 2015

(65) Prior Publication Data
US 2016/0109510 A1   Apr. 21, 2016

(30) Foreign Application Priority Data

Oct. 17, 2014   (WO) .................. PCT/IB2014/002476

(51) Int. Cl.
*G01R 31/28* (2006.01)
*G01R 1/04* (2006.01)

(52) U.S. Cl.
CPC .......... *G01R 31/2875* (2013.01); *G01R 1/045* (2013.01); *G01R 31/2822* (2013.01)

(58) Field of Classification Search
CPC . G01R 31/2875; G01R 31/2822; G01R 1/045
See application file for complete search history.

(56) References Cited

U.S. PATENT DOCUMENTS

| | | | |
|---|---|---|---|
| 5,572,144 A | 11/1996 | Davidson et al. | |
| 9,506,973 B2* | 11/2016 | Simmons | G01R 31/2865 |
| 2004/0227536 A1* | 11/2004 | Sugiyama | G01R 1/06705 |
| | | | 324/750.03 |

FOREIGN PATENT DOCUMENTS

EP   0 661 545 A2   12/1994

OTHER PUBLICATIONS

Newport, "PVIV Temperature Controlled Vacuum Chuck Kit" downloaded from http://www.newport.com/PVIV-Temperature-Controlled-Vacuum-Chuck-Kit/853272/1033/info.aspx on Mar. 17, 2015, 2 pages.
PV Measurements, "TFI-5M Vacuum Test Fixture for I-V Measurements—Test Fixtures for I-V Measurements," downloaded from http://www.pvmeasurements.com/Products/I-V-Measurements/tfi-5m-vacuum-test-fixture-for-i-v-measurements.html>> on Mar. 17, 2015, 5 pages.

\* cited by examiner

*Primary Examiner* — David M Gray
*Assistant Examiner* — Michael Harrison
(74) *Attorney, Agent, or Firm* — Charlene R. Jacobsen

(57) ABSTRACT

The invention provides a test board support platform for supporting a test board during tests, the platform comprising a heat conductive interface arranged to contact a bottom side of the test board at a first side of the heat conductive interface. The support platform also comprises a thermal conditioner coupled to a second side of the heat conductive interface, the second side being opposite the first side. By using this test board support platform a test board can be supported and thermally controlled in a way so that a DUT positioned on the test board can be probed from above, while the temperature is controlled from below.

16 Claims, 4 Drawing Sheets

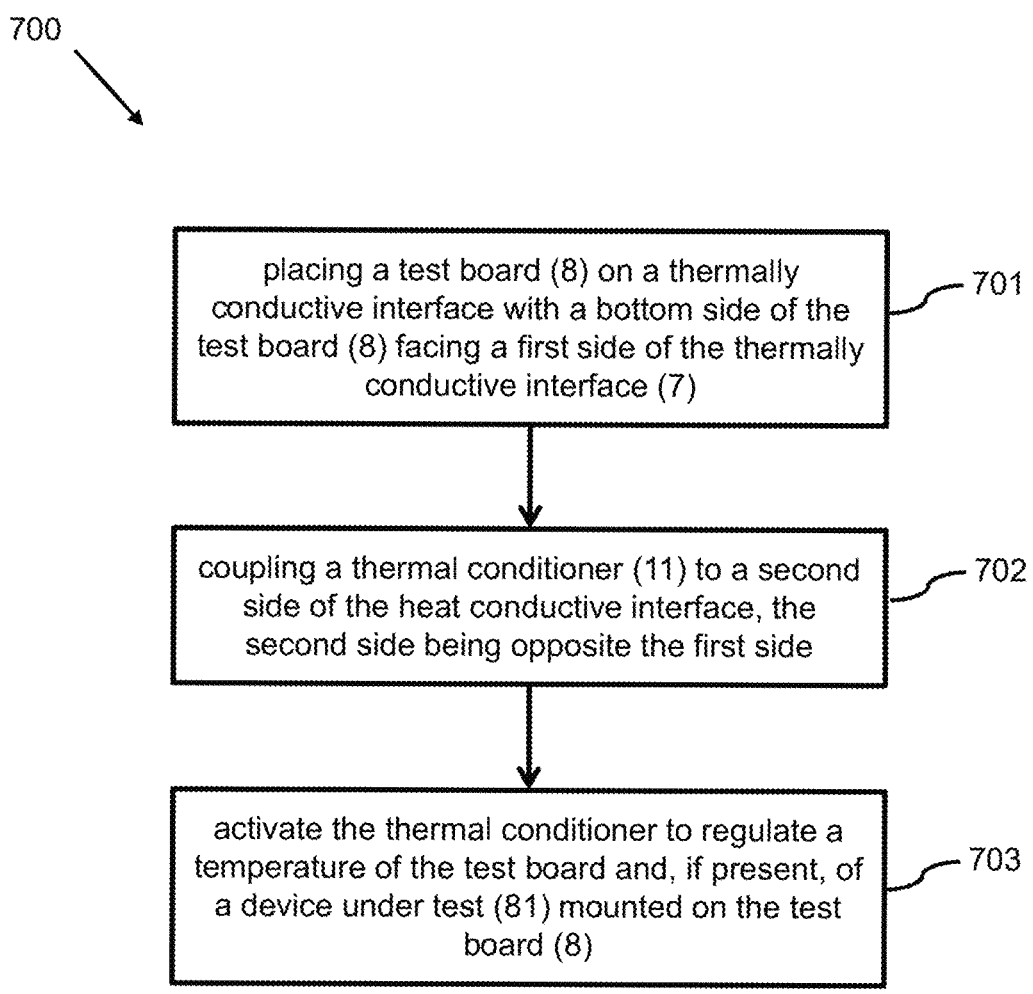

TEST BOARD SUPPORT PLATFORM FOR SUPPORTING A TEST BOARD

CROSS REFERENCE TO RELATED APPLICATION(S)

The present application claims priority to International Patent Application No. PCT/IB2014/002476, entitled "A TEST BOARD SUPPORT PLATFORM FOR SUPPORTING A TEST BOARD," filed on Oct. 17, 2014, the entirety of which is herein incorporated by reference.

FIELD OF THE INVENTION

This invention relates to a test board support platform for supporting during tests a test board with a high frequency integrated circuit mounted thereon. The invention also relates to a system for testing integrated circuits comprising such a test board supporting platform. The invention also relates to a method of supporting a test board during tests and to a method of testing integrated circuits.

BACKGROUND OF THE INVENTION

Modern wafer probe stations have been developed for making accurate measurements of semiconductor integrated circuit wafers and other electronic component applications.

High frequency integrated circuits, like Radio Detection and Ranging (RADAR) devices need to be tested on specific test boards. Until now, these integrated circuits were tested on test boards which were placed in a wafer probe station and the probing was done on the wafer probe station. However, a wafer probe station is not well equipped for (test) board alignment and proper fixation.

In some RADAR devices millimetric-wave signals are processed and/or produced. These millimetric-wave signals are only accessible through specific test probes, such as Ground-Signal-Ground (GSG) microwave probes, wherein repetitive and accurate placement on test points of the test boards is required.

Present solutions for electrical characterization in temperature are available, such as Thermal Chucks used in microwave probe systems. However, these solutions have no device under test (DUT) placement system, the temperature setting and test board fixation precision is insufficient, and these chucks have lot of thermal inertia.

SUMMARY OF THE INVENTION

The present invention relates to a test board support platform for supporting during tests a test board with a high frequency integrated circuit mounted thereon. The invention also relates to a system for testing integrated circuits comprising such a test board support platform, to a method of supporting a test board during tests and to a method of testing integrated circuits as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 7 is a flow chart of a method of supporting a test board during tests according to an embodiment.

DETAILED DESCRIPTION OF THE PREFERRED EMBODIMENTS

Figure 1:
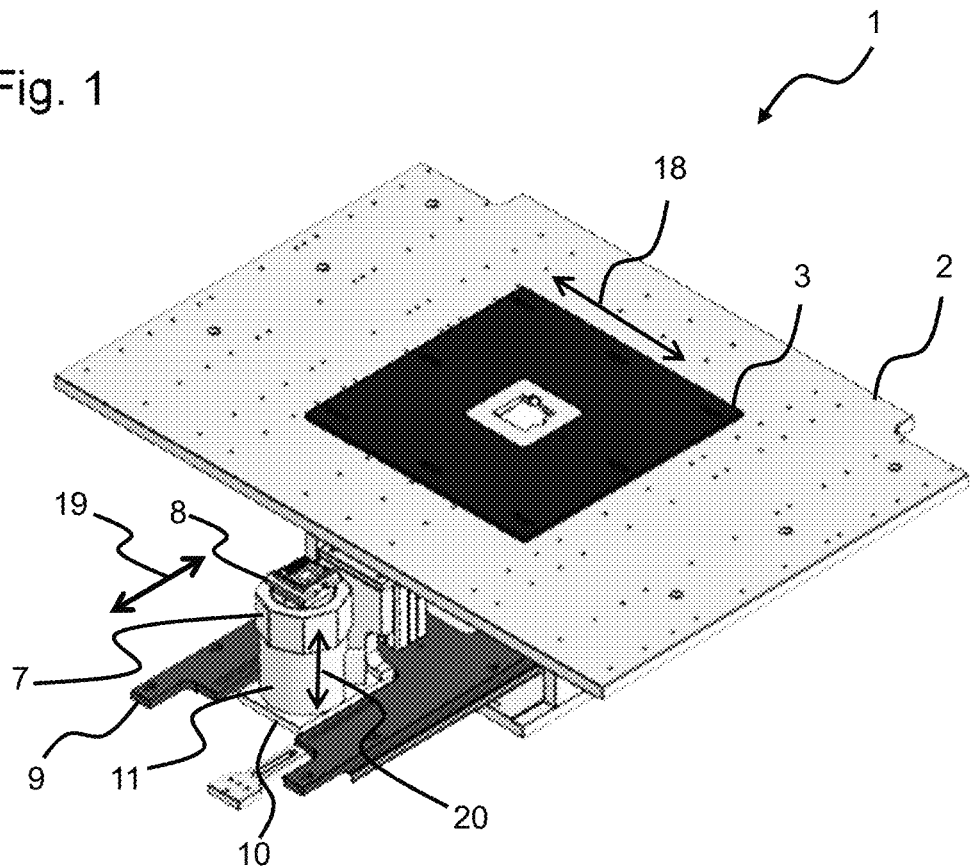
FIG. 1 schematically shows an example of an embodiment of a system for testing integrated circuits.

FIG. 1 schematically shows an example of an embodiment of a system 1 for testing integrated circuits, such as the testing of high frequency packaged IC devices. The system 1 is also referred to as probe station 1. The system 1 comprises a table 2 comprising a hole (not visible in FIG. 1). A nest support plate 3 is adjustably positioned on a first side of the table 2 at a location of the hole. In FIG. 1 the hole is completely covered by the nest support plate 3. The nest support plate 3 comprises a further hole for receiving (or holding) a test board nest 5, see FIG. 1. The system 1 comprises a card alignment plate 7 which is arranged to hold a test board 8 using a vacuum. Arranged at a second side of the table 2, opposite the first side, an actuator 10 is arranged, configured to move the card alignment plate 7 from a load position at the second side of the table 2 to a test position where the test board 8 is positioned in the test board nest 5. In the test position the test board 8 is accessible from the first side of the table 2, which is the top side of the table 2 visible in FIG. 1. The station 1 also comprises a slid 9 movably arranged at the second side of the table 2 wherein the actuator 10 is arranged on or in the slid 9. FIG. 1 also shows a thermal conditioner 11 underneath the test board 8 for regulating a temperature of the test board 8. The card alignment plate 7 acts as an interface between the thermal conditioner 11 and the test board 8.

An arrow 18 in FIG. 1 indicates that a position of the nest support plate 3 is adjustable in a first dimension, also referred to as the X-axis. For example, the nest support plate 3 may comprises elongated grooves through which screws can be inserted for fastening the nest support plate 3 onto the table 2. The table 2 may comprise a plurality of suitably positioned holes to receive the screws or other connection means. An arrow 19 indicates that the slid 9 is movable in a second dimension, also referred to as the Y-axis. An arrow 20 indicates that the test board 8 is movable in a third dimension, also referred to as the Z-axis. Moving of the movable station components along the first and second dimension may be done manually, and movement along the third dimension may be done by activating the actuator 10. However, it is noted that the positioning in all the three dimensions may be done manually or automatically using appropriate activators and/or drivers.

Figure 2:
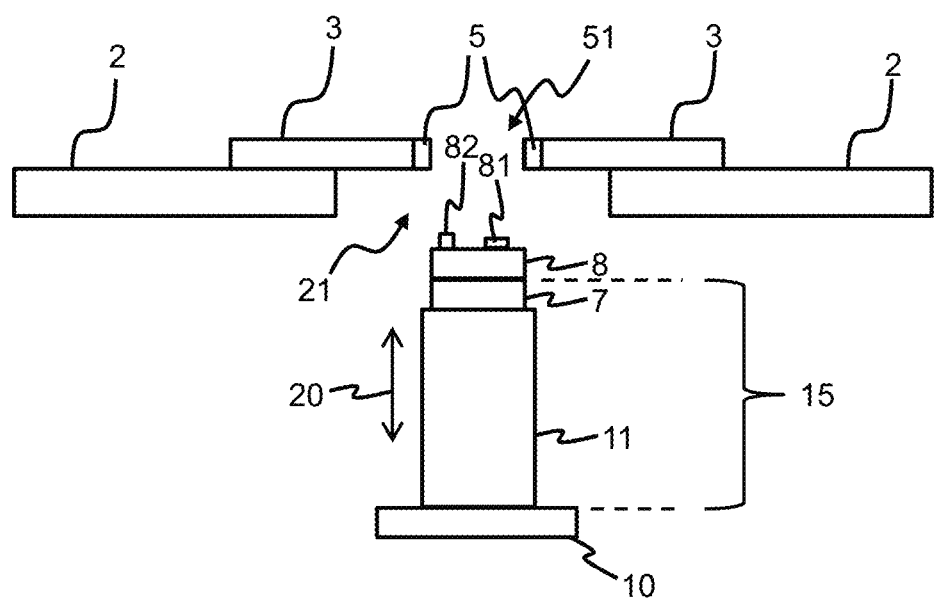
FIG. 2 schematically shows a cross section of the embodiment of FIG. 1.

FIG. 2 schematically shows a cross section of the embodiment of FIG. 1. As can be seen from FIG. 2, the table 2 comprises a hole 21 above which the nest support plate 3 is arranged. The nest support plate 3 comprises a further hole in which the test board nest 5 is located. As can be seen from FIG. 2, the test board nest 5 itself has an opening or hole 51 which is arranged to receive the test board 8 inserted from the bottom side, i.e. the second side of the table 2. The heat conductive interface 7 (i.e. the card alignment plate) and the thermal conditioner 11 together support the test board 8. As such the conductive interface 7 and the thermal conditioner 11 form a test board support platform 15.

Figure 3:
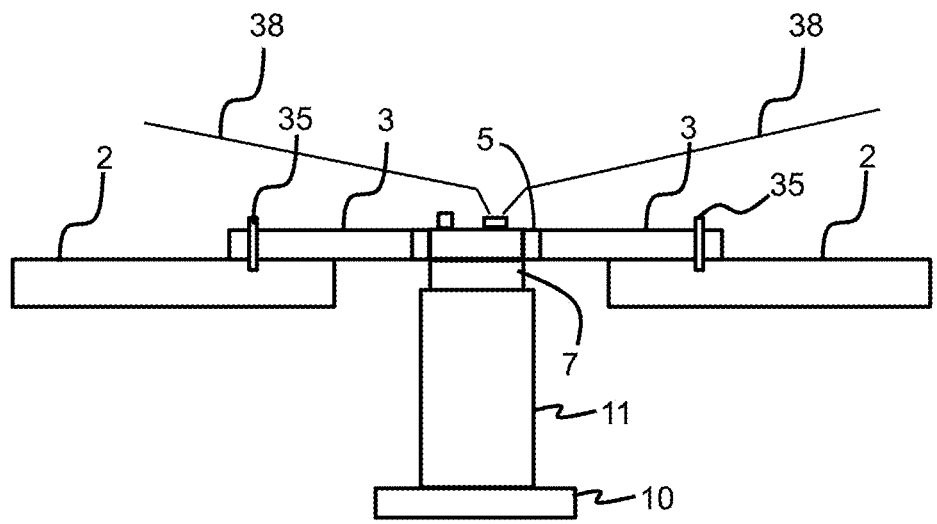
FIG. 3 schematically shows a cross section of the embodiment of FIG. 1 wherein the test board is moved into the test position.

FIG. 3 schematically shows a cross section of the embodiment of FIG. 1 wherein the test board 8 is moved into the test position. In the test position, the test board 8 is inserted in the board nest 5. The test board nest 5 allows centring, placement repeatability and mechanical stop for the table 2. It is dedicated to one PCB size and may be manufactured in polymer, Polyamide-imide (Torlon PAI) or polyétheréthercétone. It provides thermal and electrical insulation of the test board 8. After the positioning of the test board 8 into the nest 5, the nest support plate 3 is fixed onto the table 2, for example by tightening screws 35 into the table 2. Once the nest support plate 3 is fixed, one or more probes 38 are positioned onto pads present on the test board 8 or on a device under test (DUT) 81.

Once the first DUT 81 has been tested, it can be off loaded and a subsequent DUT can be tested. The subsequent DUT may be arranged on an identical test board as the first test board, so that the same test board nest can be used. As mechanical stops are set for the 3 axis, it is only necessary to load/unload test boards. There is no need to move any other setting or probes.

Figure 4:
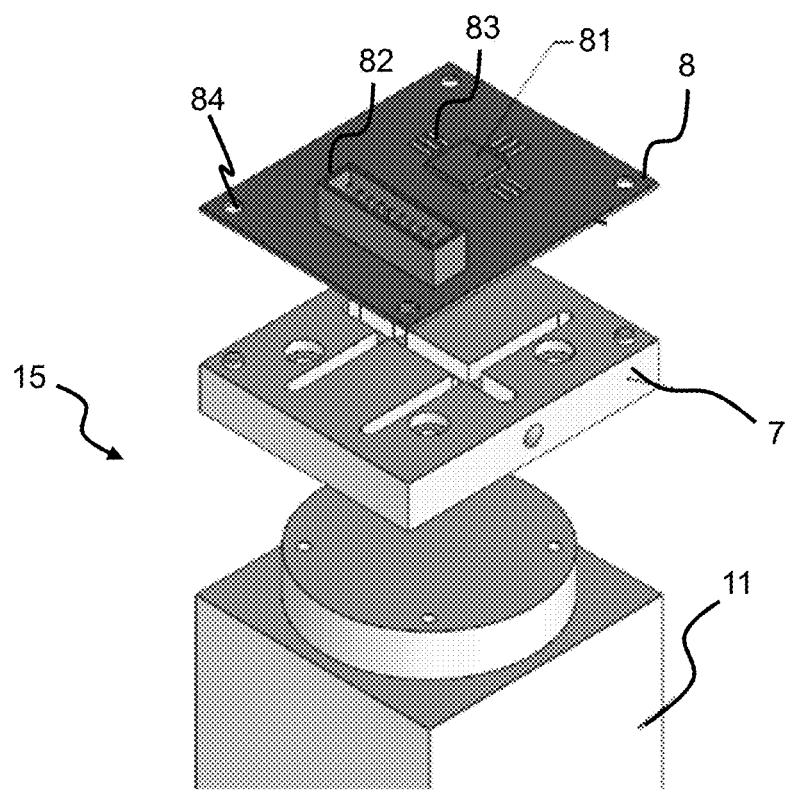
FIG. 4 shows a perspective view of an embodiment of the test board on top of the card alignment plate which is coupled to the thermal conditioner.

FIG. 4 shows an exploded view of an embodiment of the test board support platform 15 supporting a test board 8. As mentioned above, the test board support platform 15 comprises the card alignment plate 7 and the thermal conditioner 11. The thermal conditioner 11 is arranged to control a temperature of the card alignment plate 7. The thermal conditioner 11 may be embodied by or comprise a Peltier element arranged to heat up the card alignment plate 7 and by doing that heating up the DUT 81. Different types of thermal conditioners could be used, as long as they make thermal contact to the interface 7. In the example of FIG. 4, the thermal conditioner 11 comprises a disc shaped contact body at the top, but this body may be left out as well. The card alignment plate 7 may comprises a metal, such as copper or aluminium. Such materials have good heat conductance, which will lower the heat inertia of the card alignment plate 7. In this way the DUT 81 will be conditioned without losing valuable time. It is noted that instead of heating the DUT 81, the DUT may be cooled depending on the test requirements and/or application.

The test board 8 also comprises test pads 83 which are connected to inputs and/or output of the DUT 81 and can be approached by the probes 38. For example, the contact pads may be GSG 150 µm pads. For millimetric wavelength signals, probe placement repeatability and the centring will also define the measurement quality. Furthermore, the test board 8 comprises a number of alignment holes 84.

A bottom layer of the test board 8 may comprise a full copper layer so as to optimally conduct heat to the DUT 81.

Figure 5:
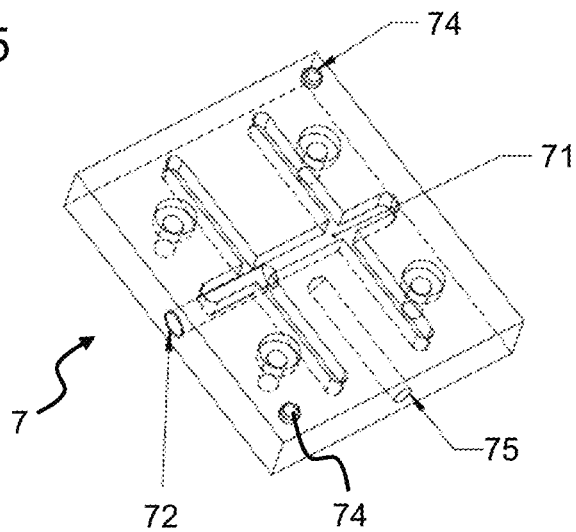
FIG. 5 is a perspective view of an embodiment of the card alignment plate.

FIG. 5 is a perspective view of an embodiment of the card alignment plate 7. The card alignment plate 7 may be a metal block comprising a number of suction channels 71 at a test board facing side, and a vacuum channel 72 in connection with the suction channels 71 for connection to a vacuum pump (not shown). The card alignment plate 7 also comprises a number of holes through which screw can be inserted to thermally couple the card alignment plate 7 onto the thermal conditioner 11. The card alignment plate 7 of FIG. 5 also comprises two alignment pins 74, which will be inserted into the alignment holes 84 present in the test board 8. By applying a vacuum through the suction channels 71, the test board 8 is clamped onto the card alignment plate 7 so that the test board 8 is hold in place relative to the card alignment plate 7 and thus to the test board platform 15.

The card alignment plate 7 also comprises a cavity 75 for receiving a temperature sensor (not shown). The temperature may be any type of temperature suitable for measuring the temperature of the card alignment plate 7, such as thermistors.

In the embodiment of FIGS. 4 and 5 the card alignment plate is substantially box shaped with a length L, a width W and a height H. In an embodiment L may be in a range of 1-10 cm, W may be in a range of 1-10 cm, and H may be in a range of 0.5-1 cm. Such dimensions will ensure a maximum contact surface to transmit the temperature and maintain the test board 8. Furthermore, in this relatively wide dimension range, one can adapt test board size without impacting thermal inertia.

Figure 6:
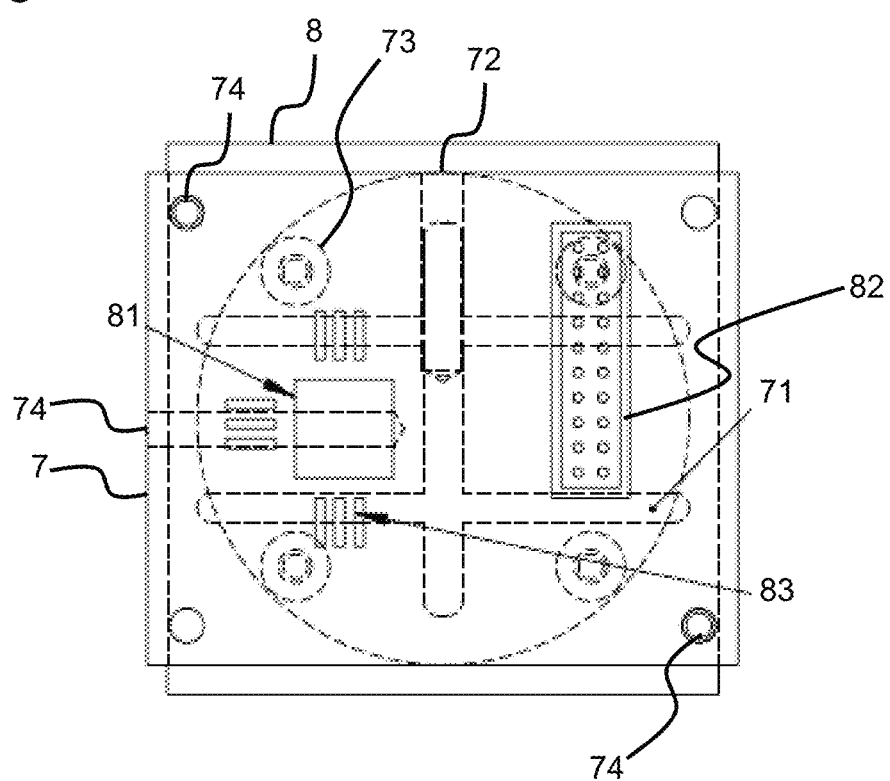
FIG. 6 is a transparent top view the test board and the card alignment plate according to an embodiment.

FIG. 6 is a transparent top view the test board 8 and the card alignment plate 7 according to an embodiment. The card alignment plate 7 is coupled to the test board 8 in such a way that a temperature sensor can be located just underneath the DUT 81. So the temperature of the DUT 81 can be measured in a very accurate way. As will be appreciated by the skilled person, the temperature sensor may be connected to a controller for controlling the thermal conditioner 7. A user interface may be arranged to set the temperature for the DUTs. The temperature to be set may differ during tests wherein electronic devices characterization requires a wide temperature range (from −55° C. to +125° C.). This allows checking DUT behaviour with environment testing depending on temperatures focusing on the usage of the proposed solution.

FIG. 7 is a flow chart of a method 700 of supporting a test board during tests. The method comprises the placing of a test board on a heat conductive interface with a bottom side of the test board facing a first side of the heat conductive interface, see action 701. Next, the method comprises the coupling a thermal conditioner to a second side of the heat conductive interface, the second side being opposite the first side, see 702. Then the method comprises the activation of the thermal conditioner to regulate a temperature of the test board and, if present, of a device under test mounted on the test board, see 703.

Using a heat conductive interface, i.e. the card alignment plate 7, a fast temperature setting is possible, saving valuable time during testing.

By heating (or cooling) the test board 8 from the backside (i.e. the side opposite the side of the probing) a DUT is easier accessible from the top side as compared to measuring systems wherein the temperature control is performed via the top side of the test boards.

Due to the low temperature inertia of the interface 7 (i.e. the card alignment plate) and the temperature sensor (for enslavement), a fast and precise temperature setting is possible. The limited thickness, e.g. 10 mm of the card alignment plate 7 in combination with a heat conductive metal results in a very low thermal inertia which speeds up the process of thermally conditioning the DUTs 81.

Due to the vacuum system and the alignment pins, a sharp (i.e. precise) and repetitive placement of the test board 8 on the system 1 is possible. Often testing requires repetitive placement of board with different boards having different DUTs or components or temperatures. To cover manufacturing variability, it is needed to measure more than one DUT. The proposed system allows to get the same test setup and environment for various DUTs of identical type and so to create statistics on measured electrical parameters. Furthermore, the described system 1 is less expensive than known wafer probers solutions, because it can be manufactured with standard mechanical tools starting from zero and creating a new station or upgrading an old one (only keeping anti-vibration table and optics).

In the foregoing specification, the invention has been described with reference to specific examples of embodiments of the invention. It will, however, be evident that various modifications and changes may be made therein without departing from the broader scope of the invention as set forth in the appended claims. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A test board support platform for supporting during tests a test board with a high-frequency integrated circuit mounted thereon, the test board support platform comprising:
    a heat conductive interface arranged to contact a bottom side of the test board at a first side of the heat conductive interface; and
    a thermal conditioner for regulating a temperature of the test board, the thermal conditioner being coupled to a second side of the heat conductive interface, the second side being opposite the first side, wherein the second side is an exterior surface of the heat conductive interface and the thermal conditioner is coupled to the second side of the heat conductive interface via at least one fastener.

2. Test board support platform according to claim 1, wherein the heat conductive interface comprises a number of suction channels at the first side, and a vacuum channel in connection with the suction channels for connection to a vacuum pump.

3. Test board support platform according to claim 1, wherein the heat conductive interface is made out of a metal.

4. Test board support platform according to claim 1, further comprising a temperature sensor arranged in the heat conductive interface.

5. Test board support platform according to claim 4, wherein the heat conductive interface comprises a cavity arranged to receive the temperature sensor.

6. Test board support platform according to claim 4, further comprising a controller arranged to receive input from the temperature sensor and to control a temperature of the thermal conditioner.

7. Test board support platform according to claim 1, wherein the heat conductive interface is substantially box shaped with a length L, a width W and a height H, wherein L is in a range of 1.0-10 cm, W is in a range of 1.0-10 cm and H is in a range of 0.5-1 cm.

8. A system for testing integrated circuits, the system comprising:
    a table comprising a hole;
    a nest support plate adjustably positioned on a first side of the table at a location of the hole and comprising a further hole for receiving a test board nest;
    a test board support platform comprising a heat conductive interface arranged to contact a bottom side of the test board at a first side of the heat conductive interface, and a thermal conditioner for regulating a temperature of the test board, the thermal conditioner being coupled to a second side of the heat conductive interface, the second side being opposite the first side, wherein the second side is an exterior surface of the heat conductive interface and the thermal conditioner is coupled to the second side of the heat conductive interface via at least one fastener;
    an actuator arranged at a second side of the table, opposite the first side, the actuator being arranged to move the test board support platform from a load position at the second side of the table to a test position where the test board is positioned in the test board nest, so that the test board is accessible from the first side of the table.

9. System according to claim 8, wherein the system comprises one or more probes arranged at the first side of the table.

10. System according to claim 8, wherein the system comprises fixation means to fixate the nest support plate on the table.

11. System according to claim 8, wherein the system comprises a slid movably arranged at the second side of the table wherein the actuator is arranged on the slid.

12. System according to claim 11, wherein a position of the nest support plate relative to the table is only adjustably in a first dimension and the position of actuator relative to the table is only adjustable in a second dimension and a position of the heat conductive interface relative to the table is only adjustable in a third dimension.

13. A method of supporting a test board during tests, the method comprising:
    placing a test board on a heat conductive interface with a bottom side of the test board facing a first side of the heat conductive interface;
    coupling a thermal conditioner to a second side of the heat conductive interface, the second side being opposite the first side, wherein the second side is an exterior surface of the heat conductive interface and the thermal conditioner is coupled to the second side of the heat conductive interface via at least one fastener;
    activating the thermal conditioner to regulate a temperature of the test board and, if present, of a device under test mounted on the test board.

14. Method according to claim 13, wherein the heat conductive interface comprises a number of suction channels at the first side, and a vacuum channel in connection with the suction channels for connection to a vacuum pump.

15. Method according to claim 13, wherein the heat conductive interface is made out of a metal.

16. Method according to claim 13, further comprising measuring of a temperature of the heat conductive interface.

* * * * *